United States Patent
Yoo et al.

(10) Patent No.: US 12,281,243 B2
(45) Date of Patent: Apr. 22, 2025

(54) METHOD OF REMOVING AN ADHESIVE FOR AN EUV MASK AND METHOD OF REUSING AN EUV MASK

(71) Applicant: SAMSUNG ELECTRONICS CO., LTD., Suwon-si (KR)

(72) Inventors: Byungchul Yoo, Yongin-si (KR); Byunghoon Lee, Osan-si (KR); Myungjun Kim, Osan-si (KR); Jikang Kim, Osan-si (KR); Jeonghwan Min, Osan-si (KR); Kyoungchae Seo, Osan-si (KR); Changyoung Jeong, Osan-si (KR)

(73) Assignees: SAMSUNG ELECTRONICS CO., LTD., Suwon-si (KR); FINE SEMITECH CORP., Osan-Si (KR)

( * ) Notice: Subject to any disclaimer, the term of this patent is extended or adjusted under 35 U.S.C. 154(b) by 156 days.

(21) Appl. No.: 17/884,077

(22) Filed: Aug. 9, 2022

(65) Prior Publication Data

US 2022/0380643 A1    Dec. 1, 2022

Related U.S. Application Data

(62) Division of application No. 16/801,677, filed on Feb. 26, 2020, now abandoned.

(30) Foreign Application Priority Data

Aug. 1, 2019    (KR) .................. 10-2019-0094032

(51) Int. Cl.
*C09J 163/00* (2006.01)
*B08B 3/04* (2006.01)
(Continued)

(52) U.S. Cl.
CPC .............. *C09J 163/00* (2013.01); *B08B 3/04* (2013.01); *B08B 3/08* (2013.01); *G03F 1/22* (2013.01); *G03F 1/82* (2013.01)

(58) Field of Classification Search
CPC ......... C09J 7/30; C09J 7/10; C09J 5/00; C09J 11/08; C09J 2301/416; C09J 2400/26;
(Continued)

(56) References Cited

U.S. PATENT DOCUMENTS 7,393,419 B2    7/2008 Sachdev et al.
8,414,708 B2    4/2013 Jeong et al.
(Continued)

FOREIGN PATENT DOCUMENTS

EP    3944017 A1 * 1/2022 .............. G03F 1/22
JP    2001-081439 A    3/2001
(Continued)

OTHER PUBLICATIONS

Notice of Allowance for corresponding application No. KR 10-2019-0094032, dated Sep. 25, 2024.

*Primary Examiner* — Vishal I Patel
(74) *Attorney, Agent, or Firm* — Muir Patent Law, PLLC

(57) ABSTRACT

An adhesive for an EUV mask includes an epoxy resin composition in an amount of 50 wt % to 80 wt % based on a total weight of the adhesive, the epoxy resin composition including an epoxy resin, a hardener, a toughening agent, a filler, and a curing accelerator, and an inorganic filler in an amount of 20 wt % to 50 wt % based on the total weight of the adhesive, the inorganic filler including one or more of aluminum hydroxide or calcium carbonate.

10 Claims, 5 Drawing Sheets

(51) Int. Cl.
*B08B 3/08* (2006.01)
*G03F 1/22* (2012.01)
*G03F 1/82* (2012.01)

(58) Field of Classification Search
CPC ...... C09J 2433/00; C09J 163/00; F16L 55/16; G03F 1/82; G03F 1/22; B08B 3/08; B08B 3/04
See application file for complete search history.

(56) References Cited

U.S. PATENT DOCUMENTS

| | | |
|---|---|---|
| 9,029,468 B2 | 5/2015 | Inui et al. |
| 9,977,326 B2 | 5/2018 | Horikoshi |
| 10,571,800 B2 | 2/2020 | Brouns et al. |
| 11,377,576 B2 | 7/2022 | Cura et al. |
| 2015/0065613 A1* | 3/2015 | Balijepalli ............... C08K 3/36 523/466 |
| 2017/0218233 A1 | 8/2017 | Lee et al. |
| 2017/0240774 A1 | 8/2017 | Devanne et al. |

FOREIGN PATENT DOCUMENTS

| | | |
|---|---|---|
| JP | 2002-249735 A | 9/2002 |
| JP | 2008-292655 A | 12/2008 |
| JP | 2011-053603 A | 3/2011 |
| KR | 10-0646070 B1 | 11/2006 |
| KR | 1020080109565 A | 12/2008 |
| KR | 10-2010-0077792 A | 7/2010 |
| KR | 1020110013705 A | 2/2011 |
| KR | 1020170109056 A | 9/2017 |
| KR | 1020180083414 A | 7/2018 |
| KR | 10-1906805 B1 | 10/2018 |

\* cited by examiner

METHOD OF REMOVING AN ADHESIVE FOR AN EUV MASK AND METHOD OF REUSING AN EUV MASK

CROSS-REFERENCE TO RELATED APPLICATIONS

This is a divisional application based on pending application Ser. No. 16/801,677, filed on Feb. 26, 2020, the entire contents of which is hereby incorporated by reference.

Korean Patent Application No. 10-2019-0094032, filed on Aug. 1, 2019, in the Korean Intellectual Property Office, and entitled: "Adhesive for EUV Mask, Cleaning Method of the Same, and Reusing Method of EUV Mask Using the Same," is incorporated by reference herein in its entirety.

BACKGROUND

1. Field

Embodiments relate to an adhesive for an EUV mask, a cleaning method of the adhesive, and a reusing method for an EUV mask using the cleaning method.

2. Description of the Related Art

An EUV pellicle may be used to protect an EUV mask. An adhesive for EUV mask including an epoxy resin composition may be used to attach the EUV pellicle to the EUV mask.

SUMMARY

Embodiments are directed to an adhesive for an EUV mask, the adhesive including an epoxy resin composition in an amount of 50 wt % to 80 wt % based on a total weight of the adhesive, the epoxy resin composition including an epoxy resin, a hardener, a toughening agent, a filler, and a curing accelerator, and an inorganic filler in an amount of 20 wt % to 50 wt % based on the total weight of the adhesive, the inorganic filler including one or more of aluminum hydroxide or calcium carbonate.

Embodiments are also directed to a method of removing an EUV mask adhesive that includes an epoxy resin composition and an inorganic filler, the method including swelling the adhesive that is present between an EUV mask and a stud by adding water to the adhesive to form a swollen adhesive, wherein swelling the adhesive includes an adsorption reaction in which the inorganic filler and the water are adsorbed to each other, and removing the swollen adhesive by adding a strong acid to the swollen adhesive, wherein removing the swollen adhesive includes an acid-base reaction between the inorganic filler and the strong acid.

Embodiments are also directed to a method of reusing an EUV mask, the method including i) applying an adhesive on an EUV mask, ii) attaching a stud on the adhesive for EUV mask, iii) combining an EUV pellicle on the stud, iv) separating the EUV pellicle from the stud, v) detaching the stud from the EUV mask, and vi) removing the adhesive from the EUV mask. Operations i) to vi) may be repeatedly performed.

BRIEF DESCRIPTION OF THE DRAWINGS

Features will become apparent to those of skill in the art by describing in detail example embodiments with reference to the attached drawings in which.

DETAILED DESCRIPTION

Figure 1:
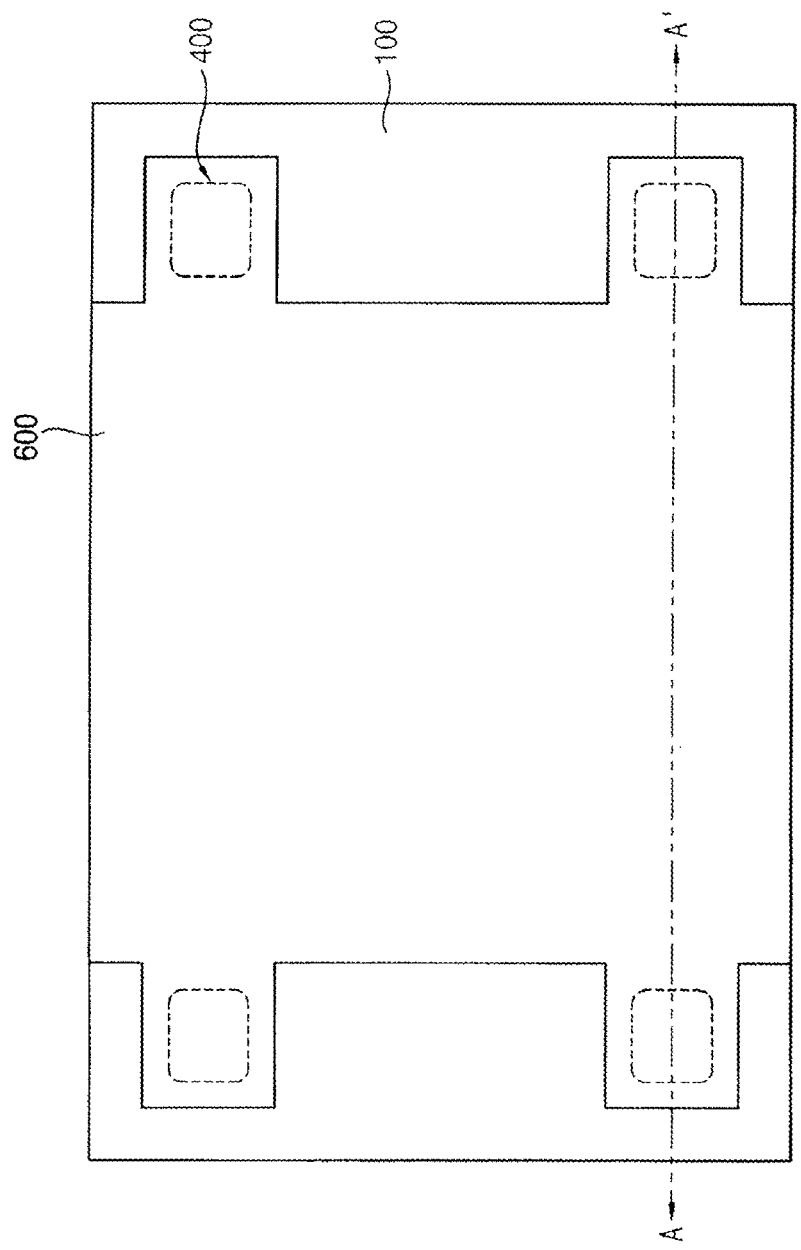
FIGS. 1 and 2 illustrate a plan view and a cross-sectional view of a method of attaching and detaching an EUV pellicle in accordance with an example embodiment.

An adhesive for EUV mask, a cleaning method of the adhesive, and a reusing method of EUV mask using the cleaning method in accordance with an example embodiment will be described more fully hereinafter with reference to the accompanying drawings.

Adhesive for EUV Mask

An adhesive for EUV mask in accordance with an example embodiment may include an epoxy resin composition and an inorganic filler. The epoxy resin composition may include an epoxy resin, a hardener, a toughening agent, a filler, and a curing accelerator, and having a thermosetting property, and an inorganic filler. The adhesive for EUV mask may be manufactured by physically stirring the epoxy resin composition and the inorganic filler.

The hardener of the epoxy resin composition may include, e.g., one or more of an ether diamine, an aliphatic diamine, or an aromatic diamine.

The epoxy resin of the epoxy resin composition may include, e.g., one or more of a bisphenol A epoxy resin, a bisphenol F epoxy resin, or a novolac epoxy resin.

The toughening agent of the epoxy resin composition may include, e.g., a modified epoxy resin having a carboxyl group or an amine group as an end group or pendant group.

The filler of the epoxy resin composition may include, e.g., one or more of amorphous silica, aluminum trihydrate, calcium carbonate, polystyrene (PS) beads, or polymethyl methacrylate (PMMA) beads.

The curing accelerator of the epoxy resin composition may include, e.g., one or more of a tertiary amine, a polyether amine, or imidazole.

The inorganic filler of the adhesive may include, e.g., one or more of silica, alumina, barium sulfate, talc, clay, mica, aluminum hydroxide, magnesium hydroxide, calcium carbonate, magnesium carbonate, magnesium oxide, boron nitride, aluminum borate, barium titanate, calcium titanate, magnesium titanate, bismuth titanate, titanium dioxide, barium zirconate, or calcium zirconate.

In an example embodiment, the inorganic filler may have a high electronegativity. Thus, adsorption of water molecules may readily occur. For example, when the inorganic filler is aluminum hydroxide ($Al(OH)_3$), the inorganic filler may have a plurality of hydroxyl group (—OH) that provide increased hydrophilicity and, thus, the adsorption between the inorganic filler and the water may be increased. Accordingly, the adhesive for EUV mask including the inorganic filler may absorb the water. Thus, a swelling of the adhesive may occur due to the water molecules that penetrate between the polymer chains of the adhesive, and a detergency of the adhesive for EUV mask may be improved.

In addition, the inorganic filler may increase the detergency of the adhesive for EUV mask by reacting with a cleaning solution containing a strong acid. For example, when the inorganic filler is aluminum hydroxide ($Al(OH)_3$) and the strong acid is sulfuric acid ($H_2SO_4$), a dissolution of the adhesive for EUV mask may be promoted by an acid-base reaction like Scheme 1, below.

   <Scheme 1>

In an example embodiment, the inorganic filler may have a size, e.g., an average particle size, of 0.1 μm to 10 μm.

In an example embodiment, the adhesive for EUV mask may include, based on the total weight thereof, 50 wt % to 80 wt % of the epoxy resin composition, and 20 wt % to 50 wt % of the inorganic filler.

When the content of the epoxy resin composition of the adhesive for EUV mask is increased, the adhesion may be increased, but as the content of the inorganic filler is relatively decreased, the detergency or ease with which it is removed may be decreased.

On the other hand, when the content of the epoxy resin composition of the adhesive for EUV mask is decreased, the adhesion may be decreased, but as the content of the inorganic filler is relatively increased, the detergency may be increased.

The epoxy resin composition of the adhesive for EUV mask may include, based on the total weight thereof, 40 wt % to 70 wt % of the hardener, 15 wt % to 40 wt % of the epoxy resin, 7 wt % to 13 wt % of the toughening agent, 3 wt % to 7 wt % of the filler, and 1 wt % to 5 wt % of the curing accelerator.

When the content of the hardener of the epoxy resin composition is increased, the mechanical property of the epoxy resin composition may be increased, but the detergency thereof may be decreased. On the other hand, when the content of the hardener of the epoxy resin composition is decreased, the mechanical property of the epoxy resin composition may be decreased, but the detergency thereof may be increased.

When the content of the epoxy resin of the epoxy resin composition is increased, the adhesion of the epoxy resin composition may be increased, but the detergency thereof may be decreased. On the other hand, when the content of the epoxy resin of the epoxy resin composition is decreased, the adhesion of the epoxy resin composition may be decreased, but the detergency thereof may be increased.

When the content of the toughening agent of the epoxy resin composition is increased, the toughness of the epoxy resin composition may be increased, but the detergency thereof may be decreased. On the other hand, when the content of the toughening agent of the epoxy resin composition is decreased, the toughness of the epoxy resin composition may be decreased, but the detergency thereof may be increased.

By adjusting the content of the filler of the epoxy resin composition, it is possible to adjust the viscosity of the adhesive for EUV mask including the epoxy resin composition, and to prevent cracking.

When the content of the curing accelerator of the epoxy resin composition is increased, the curing rate of the epoxy resin composition may be increased. On the other hand, when the content of the curing accelerator of the epoxy resin composition is decreased, the curing rate of the epoxy resin composition may be decreased.

The adhesive for EUV mask according to an example embodiment may include the inorganic filler. Thus, as compared to a general adhesive of the same weight, the ratio of the epoxy resin composition of the adhesive for EUV mask may be lower, and thus an out-gassing that occurs when removing the adhesive for EUV mask may be reduced.

Method of Attaching and Detaching an EUV Pellicle

Figure 2:
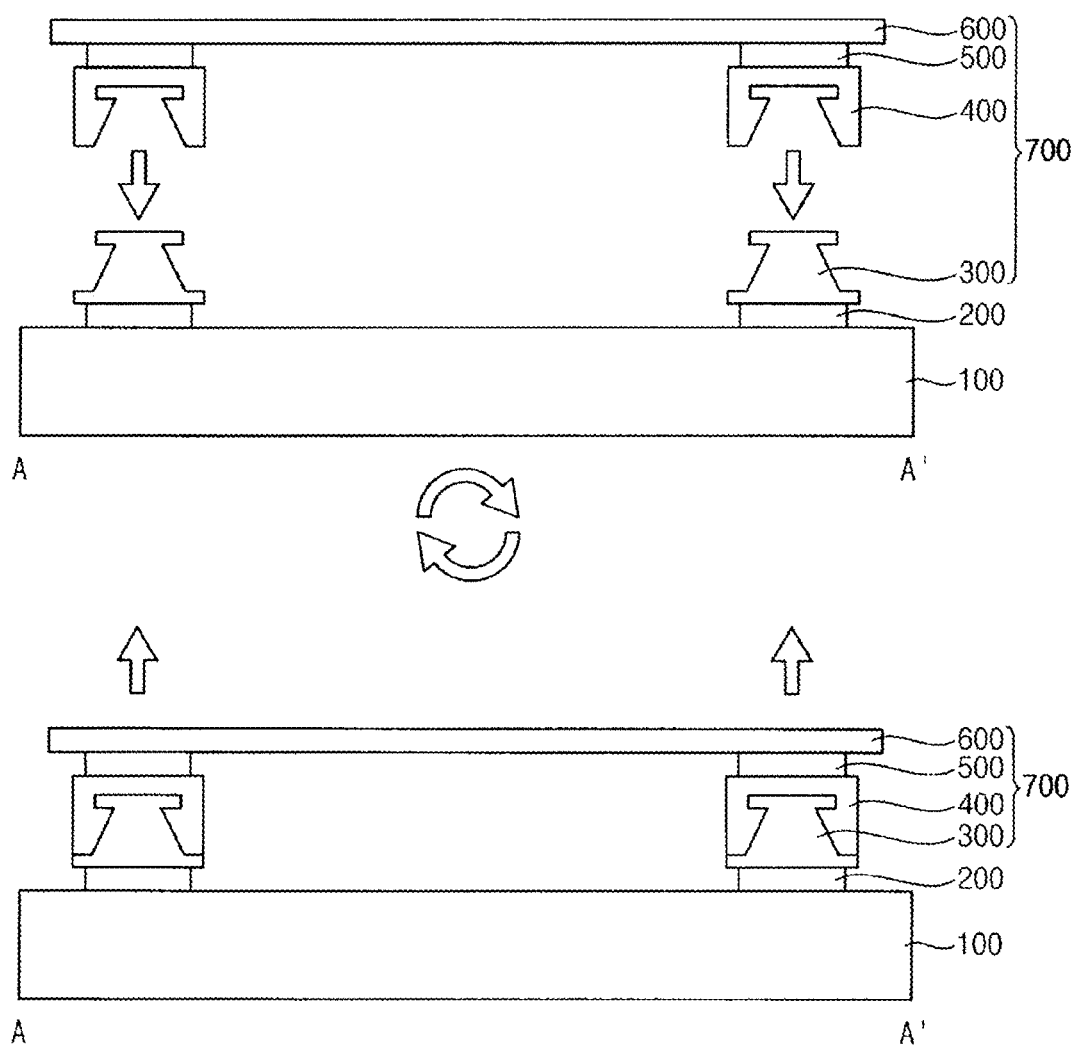

FIGS. 1 and 2 are, respectively, a plan view and a cross-sectional view illustrating a method of attaching and detaching an EUV pellicle in accordance with an example embodiment. FIG. 2 is a cross-sectional view taken along a line A-A' of FIG. 1.

Referring to FIGS. 1 and 2, an adhesive for EUV mask 200 (also referred to as the adhesive 200) may be applied on an EUV mask 100, and an EUV pellicle 700 may be attached and detached on the adhesive 200. The EUV pellicle 700 may be a reflective EUV pellicle or a transmissive EUV pellicle.

The EUV mask 100 may include various patterns for forming various semiconductor devices, e.g., active fins, transistors, contact plugs, and wirings, etc., and may be used in an EUV lithography process. The EUV mask 100 may also be used to form various display devices on a display substrate.

The adhesive 200 may be formed using the above-described epoxy resin composition and inorganic filler.

The EUV pellicle 700 may include a stud 300, a frame 400, a membrane adhesive layer 500 (or pellicle adhesive layer) and a pellicle membrane 600 sequentially formed on the EUV mask 100. The stud 300 may be attached on the EUV mask 100 by the adhesive 200. The frame 400 may be combined with the stud 300, the membrane adhesive layer 500 may be formed on the frame 400, and the pellicle membrane 600 may be attached on the frame 400 by the membrane adhesive layer 500.

The stud 300 may include a convex portion to be physically combined with the frame 400. In an example embodiment, the stud 300 may include a metal having excellent heat dissipation and strength, e.g., aluminum, anodized aluminum, stainless steel (SUS), aluminum treated by diamond-like carbon (DLC), SUS treated by DLC, silicon, and the like.

The frame 400 may include a concave portion corresponding to the concave portion of the stud 300 to be physically combined therewith. In an example embodiment, the frame 400 may include substantially the same material as the stud 300.

The stud 300 and the frame 400 may be sequentially disposed on the EUV mask 100, and may serve to support the pellicle membrane 600 to be spaced apart from the EUV mask 100 at a defined interval.

In an example embodiment, the stud 300 and the frame 400 may have various shapes, e.g., a circle, a rectangle, etc., in the plan view.

The membrane adhesive layer 500 may be formed using the above-described epoxy resin composition and inorganic filler. In another example embodiment, the membrane adhesive layer 500 may not include the inorganic filler of the adhesive 200.

The pellicle membrane 600 spaced apart from the EUV mask 100 may have a thin film form. The pellicle membrane 600 may have a high transmittance for light emitted from a light source, e.g., about 80% or more for extreme ultraviolet rays. In an example embodiment, the pellicle membrane 600 may have a transmittance of about 90% or more.

In an example embodiment, the pellicle membrane 600 and the EUV mask 100 may be spaced apart from each other, e.g., at an interval of 1 mm to 10 mm.

In an example embodiment, the pellicle membrane 600 may include various materials having high transmittance to extreme ultraviolet rays, e.g., polycrystalline silicon, single crystalline silicon, silicon nitride, or a combination thereof.

In other example embodiments, the pellicle membrane 600 may include a carbon-based material, e.g., amorphous carbon, graphene, nanometer-thickness graphite, carbon nanosheet, carbon nanotube, silicon carbide (SiC), boron carbide ($B_4C$), or a combination thereof.

In an example embodiment, the pellicle membrane 600 may include nanocrystalline graphene. The nanocrystalline graphene may include a plurality of crystal grains of nanoscale, and the plurality of crystal grains may include a two-dimensional carbon structure having an aromatic ring structure. The size (length or diameter) of the plurality of crystal grains may be several hundred nm or less, e.g., about 100 nm or less. The two-dimensional carbon structure may have a layered structure in which carbon atoms are two-dimensionally arranged. The grains of the nanocrystalline graphene may include a defect. For example, the defect may include at least one of $sp^3$ carbon (C) atoms, hydrogen (H) atoms, oxygen (O) atoms, nitrogen (N) atoms, and carbon vacancies.

In an example embodiment, the pellicle membrane 600 may include a semiconductor material having a two-dimensional crystal structure. For example, the pellicle membrane 600 may include transition metal decalcogenide (TMD). The TMD may include one of metal elements of Mo, W, Nb, V, Ta, Ti, Zr, Hf, Tc, Re, Cu, Ga, In, Sn, Ge, and Pb, and one of chalcogen elements of S, Se, and Te.

In an example embodiment, the pellicle membrane 600 may include a fluorine-based polymer.

In an example embodiment, the pellicle membrane 600 may have a multi-layer structure made of a combination of the materials described above. The pellicle membrane 600 may also have a single-layer structure.

The pellicle membrane 600 may further include a protection layer that is combined with one or both surfaces of the pellicle membrane 600, and including SiC, $SiO_2$, $Si_3N_4$, SiON, $Y_2O_3$, YN, Mo, Ru, Rh, BN, $B_4C$, B, or a combination thereof.

FIG. 1 illustrates an example in which the pellicle membrane 600 does not cover the entire surface of the EUV mask 100 in the plan view, but the pellicle membrane 600 may also cover the entire surface of the EUV mask 100 in the plan view.

In an example embodiment, the thickness of the pellicle membrane 600 may be about 200 nm or less, e.g., 1 nm to 100 nm.

As described in further detail below, for cleaning off of the adhesive 200, the frame 400 of the EUV pellicle 700 may be separated from the stud 300, and the stud 300 may be detached from the adhesive 200 on the EUV mask 100. The membrane adhesive layer 500 may not be cleaned, and thus the pellicle membrane 600 and the frame 400 may not be detached from each other.

Cleaning Method for the Adhesive for EUV Mask

FIGS. 3 to 6 are cross-sectional views illustrating a cleaning method of an adhesive for EUV mask in accordance with an example embodiment. FIGS. 3 to 6 are cross-sectional views taken along the line A-A' of FIG. 1.

Figure 3:
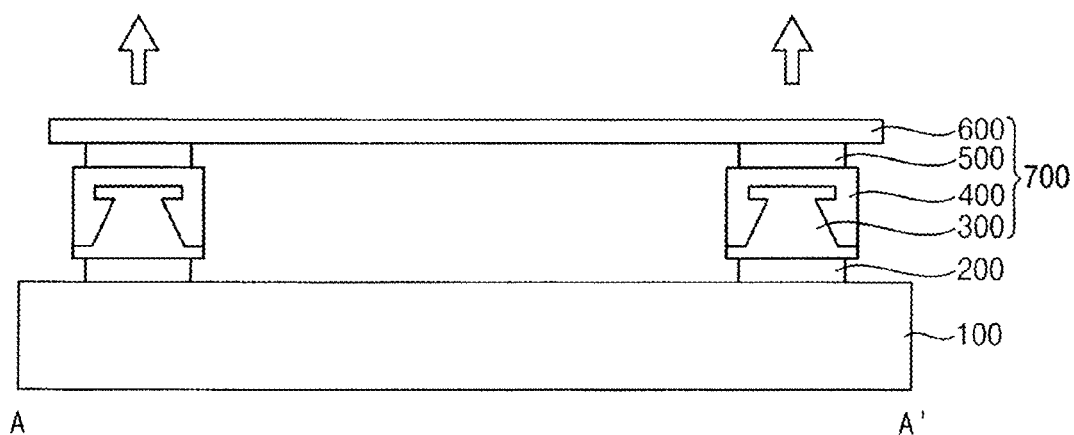
FIGS. 3 to 6 illustrate cross-sectional views of a cleaning method of an adhesive for EUV mask in accordance with an example embodiment.

Referring to FIG. 3, the frame 400 may be separated from the stud 300 attached on the adhesive 200 by applying a physical pressure, and thus the pellicle membrane 600 attached on the frame 400 may also separated together therewith.

The EUV mask 100 and the stud 300 attached by the adhesive 200 may not be readily separated by physical pressure. Similarly, the frame 400 and the pellicle membrane 600 attached by the membrane adhesive layer 500 may not be readily separated by physical pressure.

Accordingly, only the adhesive 200 and the stud 300 may remain on the EUV mask 100.

Figure 4:
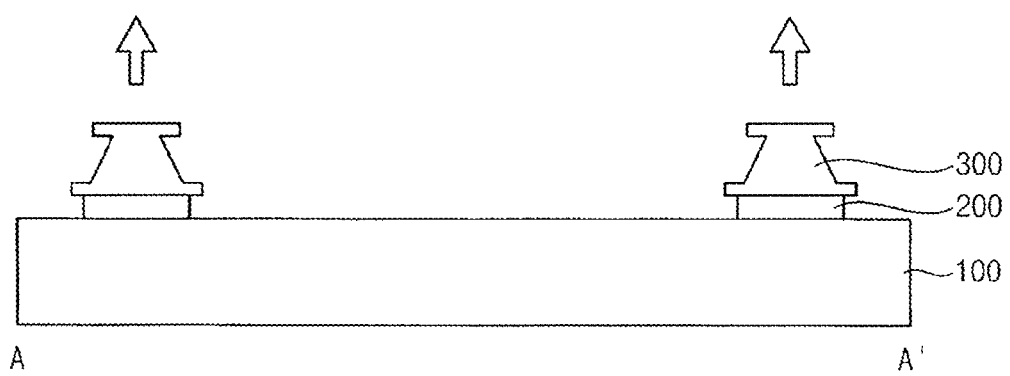

Referring to FIG. 4, the stud 300 remaining on the adhesive 200 may be detached from EUV mask 100 by applying heat and pressure. The adhesive 200 may also partially removed together with the stud 300, but may remain mostly on the EUV mask 100.

In an example embodiment, the detachment of the stud 300 may be performed at a temperature condition of about 60° C.

Figure 5:
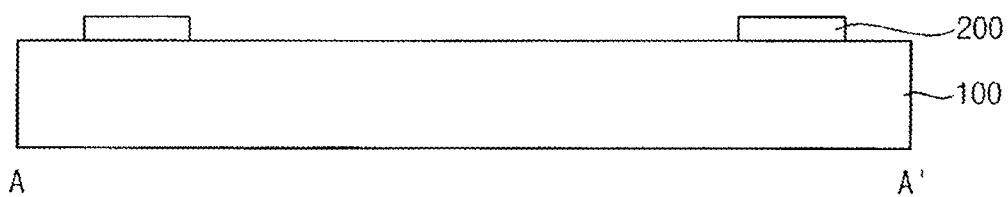

Referring to FIG. 5, the adhesive 200 remaining on the EUV mask 100 may be removed by adding a cleaning solution containing a water and a strong acid.

As the adhesive 200 may include the above-described epoxy resin composition and inorganic filler, and as the inorganic filler may have a high electronegativity, the adsorption between the adhesive 200 and the water molecules may smoothly occur. When the inorganic filler is, e.g., aluminum hydroxide ($Al_2(OH)_3$), since aluminum hydroxide ($Al_2(OH)_3$) has a plurality of hydroxyl groups (—OH), the inorganic filler may have hydrophilicity, and thus the adsorption between the adhesive 200 and the water molecules may be maximized.

Accordingly, the adhesive 200 including the inorganic filler may absorb the water and swelling may occur due to the water molecules that penetrate between the polymer chains of the adhesive 200. Thus, a detergency or ease of removal of the adhesive 200 may be improved.

In addition, the inorganic filler may increase the detergency of the adhesive 200 by reacting with a cleaning solution containing the strong acid. For example, when the inorganic filler is aluminum hydroxide ($Al(OH)_3$) and the strong acid is sulfuric acid ($H_2SO_4$), a dissolution of the adhesive 200 may be promoted by Scheme 1 as described above.

The cleaning solution may include both a water and a strong acid, and may be added at one time to remove the adhesive 200. In another example embodiment, the removal of the adhesive 200 may be performed by sequentially adding the water and the strong acid.

In an example embodiment, the water may be deionized water (DIW), and the strong acid may be sulfuric acid ($H_2SO_4$).

Figure 6:
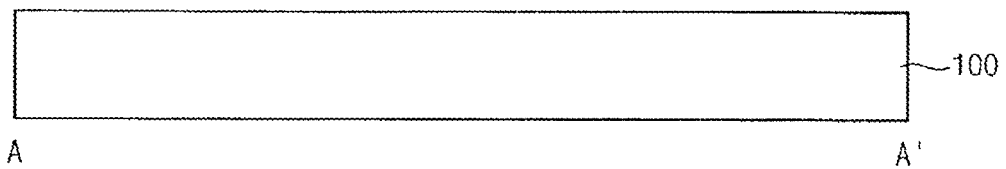

Referring to FIG. 6, the adhesive 200 may be completely removed from the EUV mask 100 through the operations described with reference to FIGS. 3 to 5. The adhesive 200 may be easily removed such that a surface of the EUV mask 100 may not be damaged.

Reusing Method for EUV Mask

Figure 7:
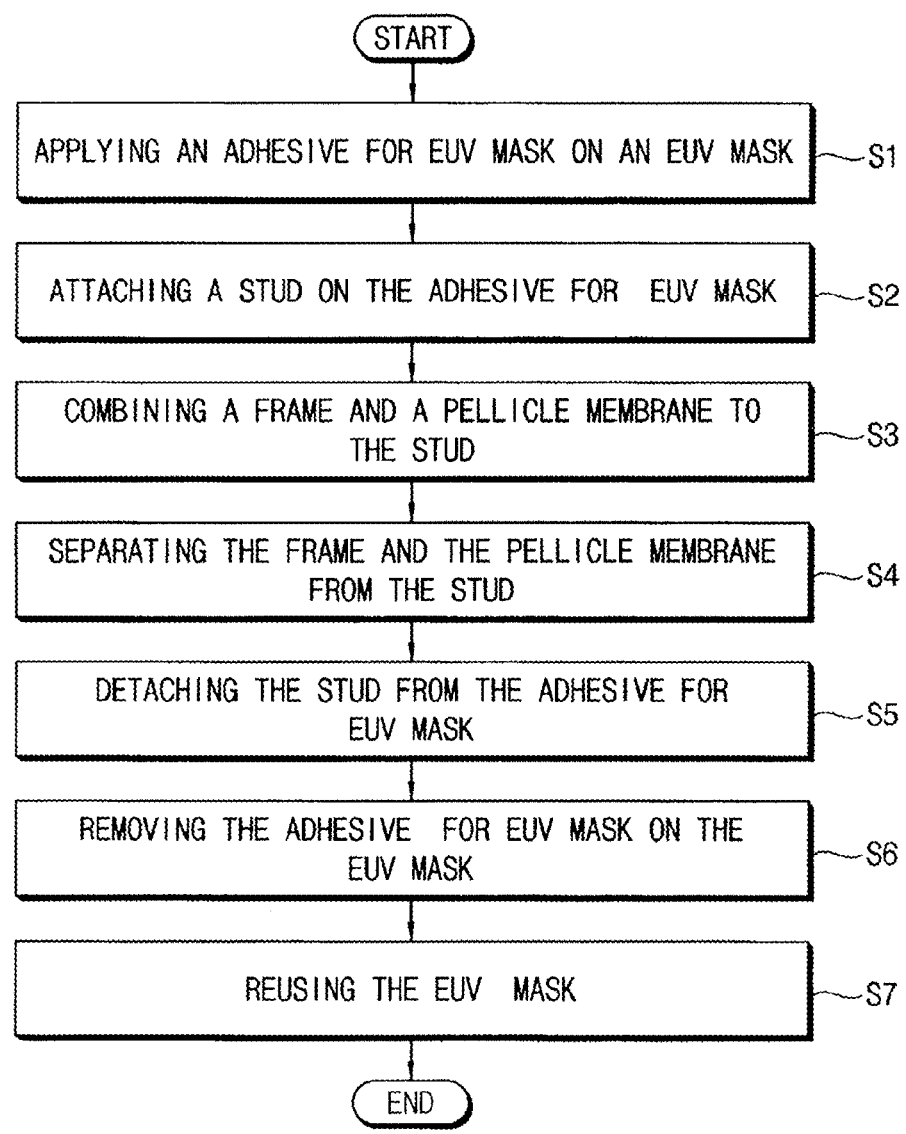
FIG. 7 illustrates a flowchart of stages of a reusing method of EUV mask in accordance with an example embodiment.

FIG. 7 is a flowchart illustrating stages of a reusing method of an EUV mask in accordance with an example embodiment.

Referring to FIG. 7, the method of reusing an EUV mask in accordance with an example embodiment may include applying the adhesive 200 on the EUV mask 100 (operation S1), attaching the stud 300 on the adhesive 200 (operation S2), combining the frame 400 and the pellicle membrane 600 on the stud 300 (operation S3), separating the frame 400 and the pellicle membrane 600 from the stud 300 (operation S4), detaching the stud 300 from the adhesive 200 (operation S5), removing the adhesive 200 on the EUV mask 100 (operation S6), and reusing the EUV mask 100 (operation S7). Operations S1 to S7 altogether may form one cycle.

Each of operations S3 and S4 may be performed in a plural number, e.g., more than other operations, in one cycle as appropriate.

Operations S1 to S7 may be repeatedly performed. Accordingly, the EUV mask 100 may be reused, so that the cost of the EUV lithography process using the same may be reduced.

Although not shown in FIG. 7, the membrane adhesive layer 500 may be further formed between the frame 400 and the pellicle membrane 600. In this case, the stud 300, the frame 400, the membrane adhesive layer 500, and the pellicle membrane 600 altogether may form the EUV pellicle 700.

By way of summation and review, a cleaning solution containing strong acid such as sulfuric acid may be used to remove an adhesive for EUV mask from an EUV mask. However, the adhesive for EUV mask may not easily removed by the cleaning solution, and even when the adhesive for EUV mask is removed, a surface of the EUV mask may be damaged by the cleaning solution.

As described above, embodiments provide an adhesive for EUV mask that is easy to clean off or remove. An adhesive for EUV mask in accordance with an example embodiment may include 50 wt % to 80 wt % of an epoxy resin composition and 20 wt % to 50 wt % of an inorganic filler, and the adhesive for EUV mask may be cleaned using a cleaning solution containing a water and a strong acid. Accordingly, even when an EUV pellicle is attached on an EUV mask by applying the adhesive for EUV mask, the adhesive for EUV mask may be easily removed after detaching the EUV pellicle, and thus the EUV mask may be reused.

Embodiments also provide a cleaning method for cleaning the adhesive off of an EUV mask. Embodiments may also provide a method of reusing an EUV mask using the cleaning method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of reusing an EUV mask, the method comprising:
   i) applying an adhesive on the EUV mask;
   ii) attaching a stud on the adhesive;
   iii) disposing a frame and a pellicle membrane on the stud;
   iv) separating the frame and pellicle membrane from the stud;
   v) detaching the stud from the EUV mask; and
   vi) removing the adhesive from the EUV mask, wherein:
   the adhesive includes an epoxy resin composition in an amount of 50 wt % to 80 wt % and an inorganic filler in an amount of 20 wt % to 50 wt % based on the total weight of the adhesive,
   the epoxy resin composition includes an epoxy resin, a hardener, a toughening agent, a filler, and a curing accelerator, and
   the inorganic filler includes aluminum hydroxide,
   wherein operation vi) includes:
   swelling the adhesive by adding water into the adhesive remaining on the EUV mask to form a swollen adhesive, and
   removing the swollen adhesive by adding a strong acid to the swollen adhesive.

2. The method as claimed in claim 1, wherein the epoxy resin composition includes:
   the epoxy resin in an amount of 15 wt % to 40 wt % based on a total weight of the epoxy resin composition,
   the hardener in an amount of 40 wt % to 70 wt % based on the total weight of the epoxy resin composition,
   the toughening agent in an amount of 7 wt % to 13 wt % based on the total weight of the epoxy resin composition,
   the filler in an amount of 3 wt % to 7 wt % based on the total weight of the epoxy resin composition, and
   the curing accelerator in an amount of 1 wt % to 5 wt % based on the total weight of the epoxy resin composition.

3. The method as claimed in claim 1, wherein the inorganic filler has an average particle size of 0.1 μm to 10 μm.

4. The method as claimed in claim 1, wherein adding the water and adding the strong acid are simultaneously performed.

5. The method as claimed in claim 4, wherein the water is deionized water, and the strong acid is sulfuric acid.

6. The method as claimed in claim 1, wherein:
   the frame and the pellicle membrane have a pellicle adhesive layer therebetween, and
   the pellicle adhesive layer is the same adhesive as the adhesive applied on the EUV mask.

7. The method as claimed in claim 1, wherein:
   the frame and the pellicle membrane have a pellicle adhesive layer therebetween, and;
   the pellicle adhesive layer includes the same epoxy resin composition as the adhesive applied on the EUV mask, and the pellicle adhesive layer does not include an inorganic filler.

8. The method as claimed in claim 1, wherein operations i) to vi) are repeatedly performed.

9. The method as claimed in claim 1, wherein the stud includes a convex portion and the frame includes a corresponding concave portion.

10. The method as claimed in claim 1, wherein the stud and the frame physically combine together.

* * * * *